United States Patent [19]

Dragone et al.

[11] Patent Number: 5,675,592
[45] Date of Patent: Oct. 7, 1997

[54] RAPIDLY TUNABLE INTEGRATED LASER

[75] Inventors: Corrado Dragone, Little Silver; Ivan P. Kaminow, Holmdel, both of N.J.

[73] Assignee: Lucent Technologies Inc., Murray Hill, N.J.

[21] Appl. No.: 597,368

[22] Filed: Feb. 8, 1996

Related U.S. Application Data

[63] Continuation of Ser. No. 334,638, Nov. 4, 1994, abandoned, and a continuation-in-part of Ser. No. 247,381, May 23, 1994, Pat. No. 5,524,014.

[51] Int. Cl.$^6$ ........................................... H01S 3/10
[52] U.S. Cl. ........................ 372/20; 372/92; 372/32
[58] Field of Search ........................ 372/20, 92, 32; 385/14

[56] References Cited

U.S. PATENT DOCUMENTS

| | | | |
|---|---|---|---|
| 5,191,625 | 3/1993 | Gustavsson | 385/14 |
| 5,339,157 | 8/1994 | Glance et al. | 385/24 |
| 5,373,516 | 12/1994 | Glance et al. | 372/20 |
| 5,373,517 | 12/1994 | Dragone et al. | 372/20 |
| 5,390,200 | 2/1995 | Zirngibl | 372/20 |

Primary Examiner—Rodney B. Bovernick
Assistant Examiner—Yisun Song
Attorney, Agent, or Firm—S. H. Mayer; B. K. Dinicola

[57] ABSTRACT

A monolithically integrated laser which is rapidly tunable over a wide optical frequency range comprises a frequency router formed in a semiconductive wafer defining a tuned cavity. A control circuit applies electrical energy to predetermined controllably transmissive waveguides connecting the frequency routing device with reflective elements defined in the wafer. This tunes the laser to a desired one of a plurality of optical frequencies. Application of such electrical energy creates frequency selective pathways through the wafer able to support selected lasing frequencies. This laser is economical to construct and is useful in high capacity, high speed optical communications networks.

6 Claims, 3 Drawing Sheets

RAPIDLY TUNABLE INTEGRATED LASER

CROSS-REFERENCE TO RELATED APPLICATIONS

This application is a continuation of Ser. No. 08/334,638 filed on Nov. 4, 1994 now abandoned and a continuation-in-part of Ser. No. 08/247,381 filed on May 23, 1994, U.S. Pat. No. 5,524,014.

This application is related to U.S. Pat. No. 5,373,517 which issued on Dec. 13, 1994 to Corrado Dragone and Ivan P. Kaminow, entitled "Rapidly Tunable Integrated Laser".

This application is related to U.S. Pat. No. 5,339,157 which issued on Aug. 16, 1994 to Bernard Glance and Robert Wilson, entitled "Rapidly Tunable Integrated Optical Filter."

This application is related to Application Ser. No. 08/019,957 of Bernard Glance and Robert Wilson, now abandoned entitled "Rapidly Tunable Wideband Integrated Optical Filter," filed in the Patent and Trademark Office on Feb. 19, 1993.

This application is related to application Ser. No. 08/019,951 of Bernard Glance and Robert Wilson, U.S. Pat. No. 5,373,516 entitled "Rapidly Tunable Wideband Integrated Laser," filed in the Patent and Trademark Office on Feb. 19, 1993.

TECHNICAL FIELD

This invention relates to optical communications systems. More particularly, this invention relates to lasers used in optical communications systems.

BACKGROUND

The capacity and speed of communications systems may be increased by transmitting information in optical form over networks composed of optically transmissive nodes, fibers, waveguides, and the like. High capacity optical communications systems require that many optical signals be frequency division multiplexed in the components of an optical network. This requires that there be a way of conveniently producing electromagnetic energy at many different frequencies. An ideal device for producing optical energy useful in an optical communications system is a laser. Until now, there has been no convenient approach to creating a large number of optical frequencies with lasers. The performance of prior lasers have been limited in terms of tuning speed, frequency selectivity, or tuning range. All of these prior devices also have been expensive to implement.

SUMMARY

In accordance with this invention, a rapidly tunable laser has been developed which provides a well-defined set of frequencies. This laser may be based upon photonic integrated circuitry which has a wide gain bandwidth. Such tunable lasers can be realized at a cost lower than that needed to implement prior lasers used in optical communications systems.

In one example of the invention, Applicants have surprisingly realized that integrated optical multiplexers and demultiplexers may be used to create a tunable laser. Examples of such devices are disclosed in U.S. Pat. Nos. 5,002,350 and 5,136,671. They may be used to create a monolithic laser rapidly tunable over a wide frequency range. In specific terms, one example of the invention comprises an N×N frequency routing device formed on a semiconductive wafer between two reflective faces. Waveguides associated with the device, which are disposed on a common side of the device, each contain an integrated optical amplifier selectively acting as a gate preventing the flow of optical energy through a respective waveguide or as a gain providing element which amplifies optical energy flowing through a respective waveguide. Selective ones of the optical amplifiers may be activated with bias current so that lasing action occurs in a predetermined path between the reflective faces. This path is such that lasing action is supported at a particular selected frequency. The laser is rapidly tunable to any of N frequencies equal to the number of input or output waveguides associated with the frequency routing device.

This is only an example of the invention. The full scope of the invention entitled to an exclusionary right is set forth in the claims at the end of this application.

DETAILED DESCRIPTION

Figure 1:
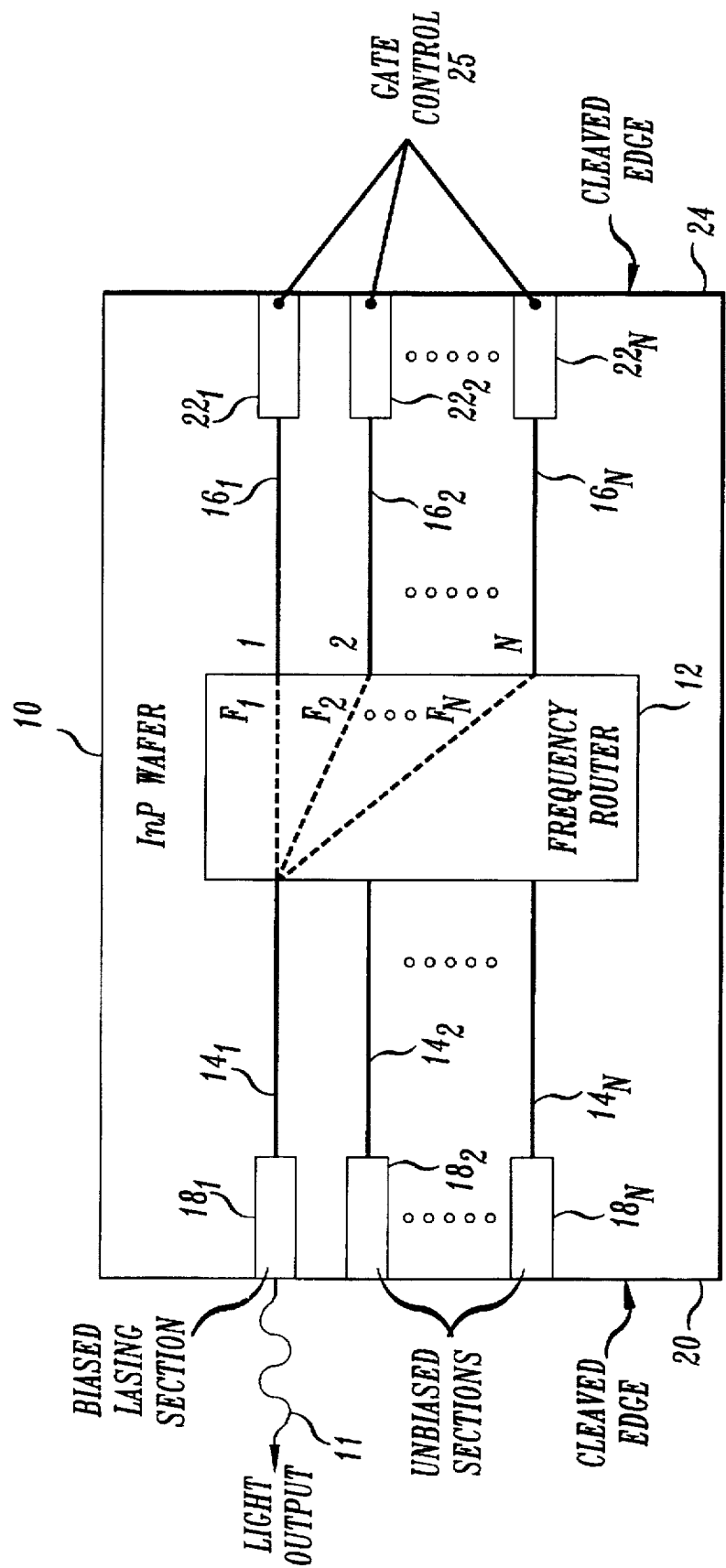
FIG. 1 is a diagram of an example of a tunable laser in accordance with this invention.

FIG. 1 shows an example of a laser which is rapidly tunable over a wide frequency range. It is composed of a frequency routing device for providing frequency selectivity, a number of waveguides for carrying optical signals, and a number of optically active sections for providing optical amplification and lasing behavior. These structures may be monolithically integrated on a semiconductive wafer. They may be created by means of known photolithographic techniques.

FIG. 1 illustrates a wafer 10 made of a semiconductive material such as an indium phosphide based material such as InGaAsP. An N×N frequency routing device 12 is defined on the wafer 10. A first plurality of waveguides $14_1$, $14_2$, ..., $14_N$ is connected to one end of the frequency routing device 12. A second plurality of waveguides $16_1$, $16_2$, ..., $16_N$ is connected to another end of the frequency routing device 12. A first plurality of optical amplifiers $18_1$, $18_2$, ..., $18_N$ connects respective ones of the first plurality of waveguides to a cleaved face 20 formed in the semiconductive wafer 10. A second plurality of optical amplifiers $22_1$, $22_2$, $22_N$ connects respective ones of the second plurality of waveguides to a second cleaved face 24 formed in the wafer 10. The two cleaved faces 20 and 24 comprise reflective mirrors defining a tuned cavity in which lasing action can be supported. A gate control circuit 25 selectively provides bias current to predetermined ones of the optical amplifiers to produce laser light at one of N discrete frequencies as indicated at reference numeral 11 in FIG. 1.

Each optical amplifier comprises a doped section of waveguide with controllable optical transmissivity. The doping may be such that an appropriately configured semiconductor junction is defined in each optical amplifier. These sections are optically active in that application of electrical energy to those sections will cause them to become transmissive to the flow of optical energy and will even provide some degree of gain to optical signals flowing through them. When electrical bias current above a lasing threshold is applied, laser action begins. These doped sections of waveguide are substantially opaque to the transmission of light when there is no applied electrical stimulation. The specially doped sections thus may be considered to be gates or optical amplifiers depending upon whether or not they are excited with electrical energy. The details of creating such sections in a wafer such as the wafer 10 shown in FIG. 1 are generally known, are not a part of this invention, and thus are not described here.

Selectively applying bias current to predetermined ones of the optical amplifiers in FIG. 1 will create certain frequency selective optical pathways between the cleaved faces 20 and 24 due to the behavior of the frequency routing device 12. Application of a certain amount of bias current above a lasing threshold to the selected ones of the optical amplifiers will cause lasing action at a frequency supported in the frequency selective optical pathways. Those optical amplifiers which are not given any bias current remain opaque to the transmission of optical energy through them.

The frequency routing device 12 is such that an optical signal having a frequency $F_1$ appearing on the waveguide $14_1$ and flowing toward the device 12 will be directed to the waveguide $16_1$. An optical signal having a frequency $F_1$ directed toward the frequency routing device 12 on waveguide $16_1$ will be directed to the waveguide $14_1$. An optical signal having a frequency $F_2$ appearing on waveguide $14_1$ and flowing toward the device 12 will be directed to the waveguide $16_2$. An optical signal having a frequency $F_2$ directed toward the frequency routing device 12 on waveguide $16_2$ will be directed toward waveguide $14_1$. In general, an optical signal having a frequency $F_i$ appearing on waveguide $14_1$ and flowing toward the device 12 will be directed to a waveguide $16_i$ by the frequency routing device. Similarly, an optical signal having a frequency $F_i$ appearing on a waveguide $16_i$ and flowing toward the frequency routing device 12 will be directed to waveguide $14_1$.

The edges of the wafer at the ends of the two sets of optical amplifiers are cleaved to form reflective mirrors with a tunable cavity between them. The amplifiers on one side of the frequency routing device 12 are used as gates opened by the bias current. When these gates are biased by a current of 10 to 20 mA, for example, these gates become optically transparent with perhaps some gain depending on the level of the bias current. They are highly optically lossy at a zero bias current. One of these optical amplifiers on one side of the wafer 10 is biased so that it is optically transmissive. The other optical amplifiers on the same side are unbiased. On the other side of the frequency routing device 12, one of the optical amplifiers is biased above a lasing threshold. The remaining amplifiers are unbiased to absorb any light reaching them. Application of bias current to the optical amplifiers in this manner determines a transparent route between the mirrors for lasing action. Along this route, stationary waves can be sustained for frequencies within a passband associated with this route. Frequencies outside this passband are suppressed by the lossy unbiased optical amplifiers. Lasing occurs at the Fabry-Perot mode whose frequency is nearest the passband maximum. Adjacent Fabry-Perot modes are suppressed by passband selectivity which can be adjusted by appropriate circuit design. There are N passbands $\Delta F$ wide repeated periodically with a free spectral range (FSR) period $N\Delta F$. Assuming that the gain of the active semiconductive medium peaks sufficiently over one of these FSRs, N lasing frequencies can be obtained in this FSR by appropriate activation of selected optical amplifiers in the wafer 10. Frequencies outside this FSR are suppressed by gain discrimination. Tuning can thus be achieved at discrete frequencies separated by intervals $\Delta F$ over a tuning range $N\Delta F$. In addition, combinations of lasing frequencies can be obtained by activating more than one amplifier section on one side of the device 12. Furthermore, amplifier sections can be modulated in order to send information.

Described here are a couple of examples illustrating how the laser of FIG. 1 may be tuned to a plurality of discrete optical frequencies. If it is desired that the laser of FIG. 1 produce optical energy at a frequency $F_1$, bias current is applied to optical amplifier $18_1$ and optical amplifier $22_1$. The bias current applied to the optical amplifier $22_1$ is above the lasing threshold for the semiconductor material. An optically transmissive path is thereby defined between the reflective faces 20 and 24 comprising the optical amplifier $18_1$, the waveguide $14_1$, the frequency routing device 12, the waveguide $16_1$, and the optical amplifier $22_1$. An optical standing wave is created between the faces 20 and 24 at the frequency $F_1$ and laser light at that frequency is output by the device of FIG. 1 as shown by reference numeral 11. In this case, face 20 may be partially transmissive and face 24 may be totally reflective. Similarly, if it is desired that tee laser of FIG. 1 produce optical energy at a frequency $F_2$, bias current is applied to the optical amplifier $18_1$ and the optical amplifier $22_2$. The bias current applied to the optical amplifier $22_2$ is above the lasing threshold for the semiconductor material. An optically transmissive path is thereby defined between the faces 22 and 24 comprising the optical amplifier $18_1$, the waveguide $14_1$, the frequency routing device 12, the waveguide $16_2$ and the optical amplifier $22_2$. An optical standing wave is created between the faces 20 and 24 at the frequency $F_2$ and laser light at that frequency is output by the device of FIG. 1 as shown by reference numeral 11. Optical energy at frequencies $F_3$ to $F_N$ may be produced by activating optical amplifiers $22_3$ to $23_N$, respectively, instead of activating the optical amplifiers $22_1$ or $22_2$. The output frequency produced by the laser in FIG. 1 may rapidly be changed by changing which optical amplifiers receive bias current.

Figure 2:
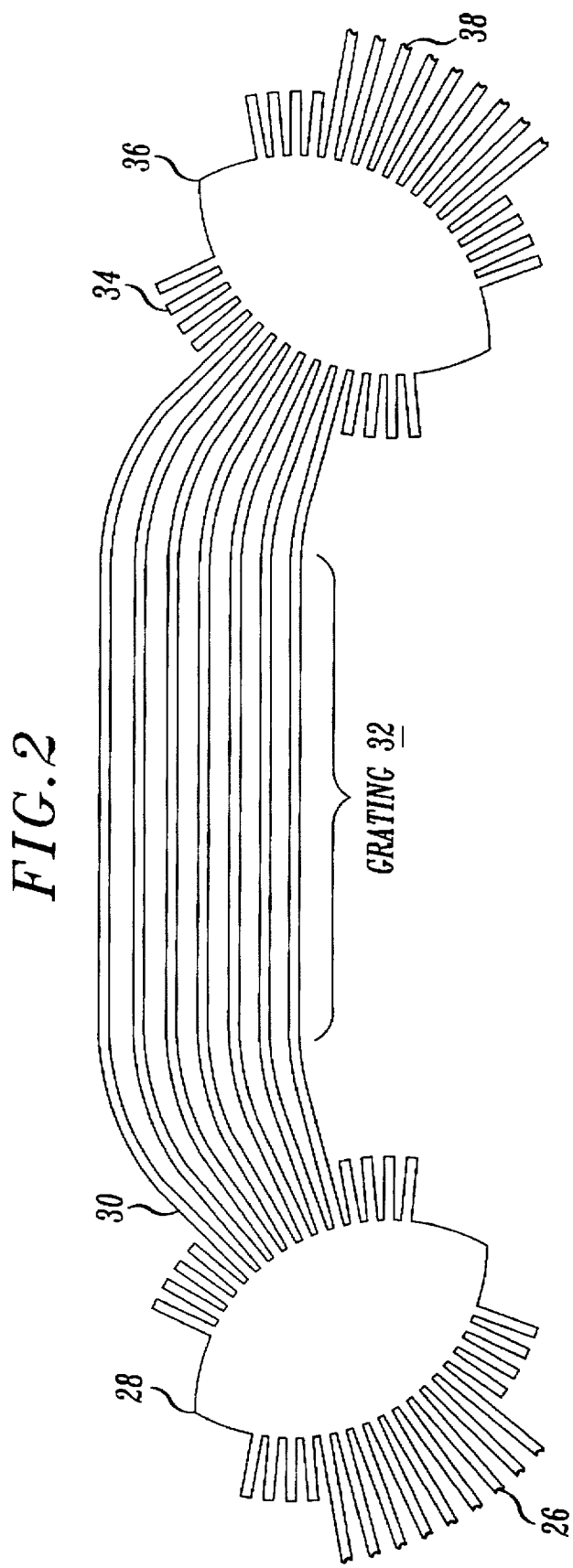
FIG. 2 is a diagram illustrating the details of the frequency routing device shown in FIG. 1.

FIG. 2 shows the pertinent details of an example of a routing device 12 shown in FIG. 1. The frequency routing device contains a plurality of input waveguides 26 connected to a free space region 28. A plurality of output waveguides 30 extends from the free space region 28 and is connected to an optical grating 32. The optical grating 32 comprises a plurality of unequal length waveguides which provides a predetermined amount of path length difference between the output waveguides 30 and a corresponding plurality of input waveguides 34 connected to another free space region 36. The free space region 36 is connected to a plurality of output waveguides 38. These frequency routing devices operate as multiplexers and demultiplexers of optical frequencies. The details of their construction and operation are more fully described in the U.S. patents referred to above, the entire contents of which are hereby incorporated by reference into this application. In the case of the frequency routing device 12 in FIG. 1, the input waveguides 26 may be connected to the waveguides $14_1, 14_2, \ldots, 14_N$, respectively. The plurality of output waveguides 38 are connected to the waveguides $16_1, 16_2, \ldots, 16_N$ in the device of FIG. 1.

The laser of FIG. 1 may be tuned to a large number of different optical frequencies used in high speed, high capacity optical communications networks. For example, frequency routing devices with N up to 32 or more may be conveniently fabricated on a single semiconductive wafer. This results in a tunable laser which can be tuned to any of up to 32 or more optical frequencies. For example, a laser using a 32×32 frequency routing device providing passbands spaced by 50 GHz will yield 32 potential frequencies of operation distributed regularly at 50 GHz intervals over a tuning bandwidth of 1600 GHz. This bandpass is thus 60% larger than that of a conventional DBR laser. The doped sections comprising the optical amplifiers in FIG. 1 may be switched on or off at up to nanosecond speeds thereby resulting in rapid tuning of the FIG. 1 laser to the desired frequencies. Devices such as the laser in FIG. 1 are attractive for large size optical network applications based on frequency division multiplexing.

In one alternative to the device shown in FIG. 1, a mirror image of the FIG. 1 device could be attached along a plane defined by face 24 in FIG. 1, in which case, high quality laser mirrors are required only adjacent two optical amplifiers, for example, amplifier $18_1$ and its mirror image.

Figure 3:
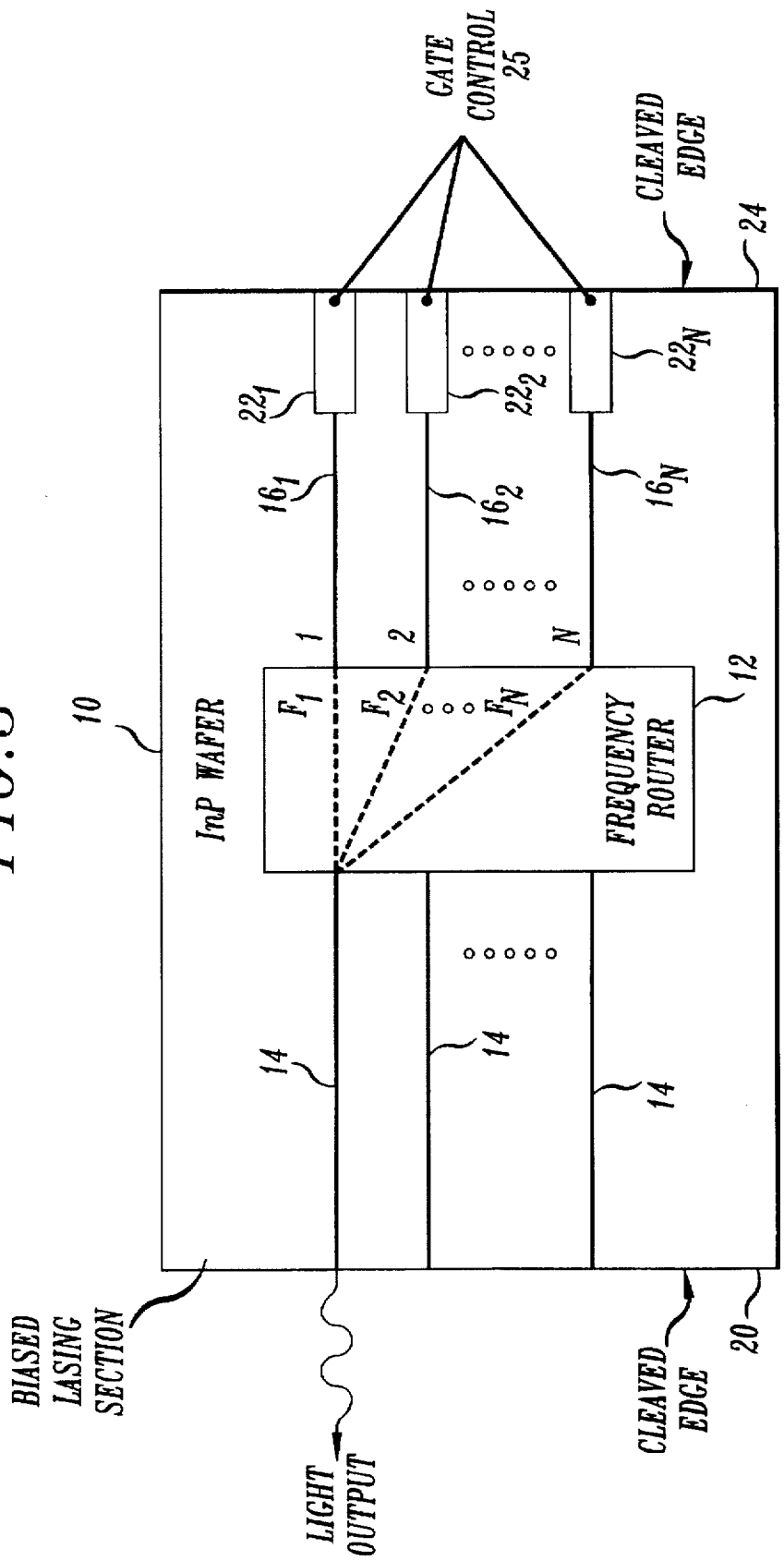
FIG. 3 is a diagram of an example of a tunable laser with only one amplifier disposed in each frequency selective pathway in accordance with this invention.

While a presently preferred embodiment of the invention employs amplifiers in waveguides on both sides of the resonant cavity, it is contemplated that the router and waveguides can be redesigned to employ amplifiers on a single side of the cavity. For example, amplifiers 18 can be eliminated from the apparatus as shown in FIG. 3 provided that only one waveguide 14 is terminated on the reflective surface. The portion of the cleaved face 20 on which the remaining waveguides 14 terminate may be provided with an antireflective coating. Since the remaining waveguides 14 are not terminated on the reflective surface, they are not capable of providing optical feedback to the cavity. In such a modified laser, it is only necessary to activate one amplifier for generating a laser output beam at a desired wavelength.

We claim:

1. A tunable laser, comprising:

a laser cavity defined by two reflective elements in an actively doped semiconductor wafer;

a frequency routing device in the cavity comprising a plurality of controllable frequency selective pathways optically connecting the reflective elements such that selective gating of one or more of the frequency selective pathways causes a selected one or more lasing frequencies to be supported in the laser cavity thereby providing tunability of the laser; and an optical amplifier disposed in each frequency selective pathway wherein each said optical amplifier is disposed in the laser cavity on a common side of said frequency routing device.

2. The tunable laser of claim 1, further comprising:

a control circuit for selectively activating the optical amplifiers to define a predetermined frequency selective pathway in the laser cavity and to create lasing action in the predetermined frequency selective pathway.

3. The tunable laser of claim 1, in which the frequency routing device comprises:

at least one input waveguide;

a first free space region connected to the at least one input waveguide;

a plurality of output waveguides connected to the first free space region;

an optical grating connected to the plurality of output waveguides comprising a plurality of unequal length waveguides;

a plurality of input waveguides connected to the optical grating;

a second free space region connected to the plurality of input waveguides connected to the optical grating; and a plurality of output waveguides connected to the second free space region.

4. The laser of claim 3 wherein said optical amplifiers are disposed in the plurality of output waveguides connected to the second free space region.

5. A tunable integrated laser, comprising:

a frequency routing device formed in a semiconductive wafer;

first and second spaced surfaces formed in the wafer, said first surface having a reflective portion and a nonreflective portion and said second surface being reflective;

a first plurality of waveguides directly connecting the first surface to the frequency routing device such that at least one of said first plurality of waveguides is connected to the reflective portion of the first surface and remaining ones of the first plurality of waveguides are connected to the nonreflective portion of the first surface;

a second plurality of waveguides connecting the frequency routing device to second surface;

a controllable optical amplifier in series with each of the second plurality of waveguides; and means for providing bias current to selected ones of the optical amplifiers for tuning the laser to a predetermined output optical frequency.

6. The laser of claim 5 wherein said nonreflective portion of the first surface comprises an antireflective coating.

* * * * *